US010429059B1

(12) United States Patent
Chen et al.

(10) Patent No.: US 10,429,059 B1
(45) Date of Patent: Oct. 1, 2019

(54) COOLING FAN

(71) Applicant: Primax Electronics Ltd., Taipei (TW)

(72) Inventors: Chung-Yuan Chen, Taipei (TW);
Wei-Chiang Huang, Taipei (TW);
Ming-Hui Yeh, Taipei (TW);
Hung-Wei Kuo, Taipei (TW); Ya-Chin Tu, Taipei (TW)

(73) Assignee: PRIMAX ELECTRONICS LTD, Taipei (TW)

( * ) Notice: Subject to any disclaimer, the term of this patent is extended or adjusted under 35 U.S.C. 154(b) by 0 days.

(21) Appl. No.: 16/110,412

(22) Filed: Aug. 23, 2018

(30) Foreign Application Priority Data

Jun. 15, 2018 (TW) .............................. 107120720 A

(51) Int. Cl.
*F21V 33/00* (2006.01)
*F21V 3/10* (2018.01)
*H05K 1/18* (2006.01)
*H05K 7/20* (2006.01)
*F24F 13/078* (2006.01)
*F21Y 115/10* (2016.01)

(52) U.S. Cl.
CPC ............ *F21V 33/0092* (2013.01); *F21V 3/10* (2018.02); *F21V 33/0096* (2013.01); *F24F 13/078* (2013.01); *H05K 1/189* (2013.01); *H05K 7/20172* (2013.01); *F21V 33/0088* (2013.01); *F21Y 2115/10* (2016.08); *H05K 2201/10106* (2013.01)

(58) Field of Classification Search
CPC ............ F21V 33/0092; F21V 33/0096; F21V 33/0088; F21F 13/078
See application file for complete search history.

(56) References Cited

U.S. PATENT DOCUMENTS

2008/0181772 A1* 7/2008 Liu ...................... F04D 25/0633
416/5
2018/0368383 A1* 12/2018 Ko ........................ A01M 1/023

* cited by examiner

*Primary Examiner* — Anne M Hines
(74) *Attorney, Agent, or Firm* — Kirton McConkie; Evan R. Witt

(57) ABSTRACT

A cooling fan includes a fan base, an impeller part, a driving part, an illumination circuit board and plural light-emitting elements. The driving part includes a shaft seat, a driving circuit board and plural coils. The driving circuit board is disposed on the fan base. The plural coils are arranged between the driving circuit board and the illumination circuit board and arranged around the shaft seat. The rotating shaft of the impeller part is inserted into the shaft seat. When an electric current flows through the plural coils, the rotating shaft is rotated. The plural light-emitting elements are disposed on the illumination circuit board. When the electric current flows through the plural light-emitting elements, the plural light-emitting elements emit light beams.

10 Claims, 13 Drawing Sheets

COOLING FAN

FIELD OF THE INVENTION

The present invention relates to a heat dissipation device, and more particularly to a cooling fan.

BACKGROUND OF THE INVENTION

Generally, during operation of an electronic device, a great deal of heat is generated. The heat may influence the performance and stability of the electronic components in the electronic device or even shorten the use lives of the electronic components. For maintaining the optimized performance of the electronic device, the electronic device is usually equipped with a heat dissipation module (e.g., a cooling fan) to remove the heat. Moreover, for increasing the application and entertainment, a cooling fan with an illuminating function has been introduced into the market.

Please refer to FIGS. 1, 2 and 3. FIG. 1 is a schematic perspective view illustrating the outer appearance of a conventional cooling fan with an illuminating function. FIG. 2 is a schematic exploded view illustrating a portion of the conventional cooling fan as shown in FIG. 1 and taken along a viewpoint. FIG. 3 is a schematic exploded view illustrating a portion of the conventional cooling fan as shown in FIG. 1 and taken along another viewpoint. The cooling fan 1 comprises a fan frame 11, a fan base 12, an impeller part 13, a driving part 14, plural light emitting diodes 15 and plural connecting elements 16. The plural connecting elements 16 are connected between the fan base 12 and the fan frame 11. Consequently, the fan base 12 is fixed at the middle region of the fan frame 11, or the fan base 12 is fixed at the position near the middle region of the fan frame 11. The driving part 14 is disposed within an accommodation space 10 between the impeller part 13 and the fan base 12. The impeller part 13 is disposed within the fan frame 11. Moreover, the impeller part 13 comprises a rotating shaft 131 and plural blades 132. The plural blades 132 are arranged around the rotating shaft 131. The driving part 14 comprises a driving circuit board 141, plural coils 142 and a shaft seat 143. The driving circuit board 141 is disposed on the fan base 12. The plural coils 142 are disposed on the driving circuit board 141. The shaft seat 143 is surrounded by the plural coils 142. The rotating shaft 131 of the impeller part 13 is inserted into the shaft seat 143, and thus the rotating shaft 131 is pivotally coupled to the shaft seat 143. When an electric current from the driving circuit board 141 flows through the plural coils 142, the rotating shaft 131 of the impeller part 13 is rotated. In response to the rotation of the rotating shaft 131, the plural blades 132 are correspondingly rotated to drive the airflow. The airflow is helpful to dissipate away the heat.

FIG. 4 is a schematic side view illustrating the relationship between the driving part and the light emitting diodes of the conventional cooling fan as shown in FIG. 1. The plural light emitting diodes 15 are disposed on the driving circuit board 141 of the driving part 14. When the electric current from the driving circuit board 141 flows through plural light emitting diodes 15, the plural light emitting diodes 15 emit light beams L1. Moreover, at least a portion of the impeller part 13 is made of a light-transmissible material or the impeller part 13 has an opening (not shown) for allowing the light beams L1 to pass through. Since the light beams L1 from the plural light emitting diodes 15 can be outputted to the surroundings, the cooling fan 1 has the illuminating efficacy.

However, due to the limitations of the installation positions of the plural light emitting diodes 15 and the position of the driving circuit board 141, some drawbacks occur. Firstly, the travelling path of the light beams L1 from the plural light emitting diodes 15 is usually obstructed by many components (e.g., the coils 142). Since the light beams are not fully utilized, the user feels that the luminance of the cooling fan 1 is insufficient. Secondly, the beam angle of the light beams L1 to be outputted from the cooling fan 1 is narrow. Thirdly, the applications of the plural light emitting diodes 15 are limited.

In other words, the conventional cooling fan 1 needs to be further improved.

SUMMARY OF THE INVENTION

An object of the present invention provides a cooling fan with an illuminating function. The plural coils of a driving part are arranged between a driving circuit board and an illumination circuit board. The light beams from plural light-emitting elements on the illumination circuit board are directly projected to an impeller part. Consequently, the luminance of the cooling fan is increased, the beam angle of the light beams to be outputted from the cooling fan is widened, and the applications of the light-emitting elements are increased.

In accordance with an aspect of the present invention, there is provided a cooling fan. The cooling fan includes a fan base, an impeller part, an illumination circuit board, a driving part and at least one light-emitting element. The impeller part includes a rotating shaft and plural blades. The plural blades are arranged around the rotating shaft. The impeller part is rotated with the rotating shaft. The illumination circuit board includes a hollow portion. The rotating shaft is penetrated through the hollow portion. The driving part includes a shaft seat, a driving circuit board and plural coils. The driving circuit board is disposed on the fan base. The plural coils are arranged between the driving circuit board and the illumination circuit board and arranged around the shaft seat. The rotating shaft is inserted into the shaft seat. When an electric current flows through the plural coils, the rotating shaft is rotated. The at least one light-emitting element is disposed on the illumination circuit board. When the electric current flows through the at least one light-emitting element, the at least one light-emitting element emits plural light beams.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
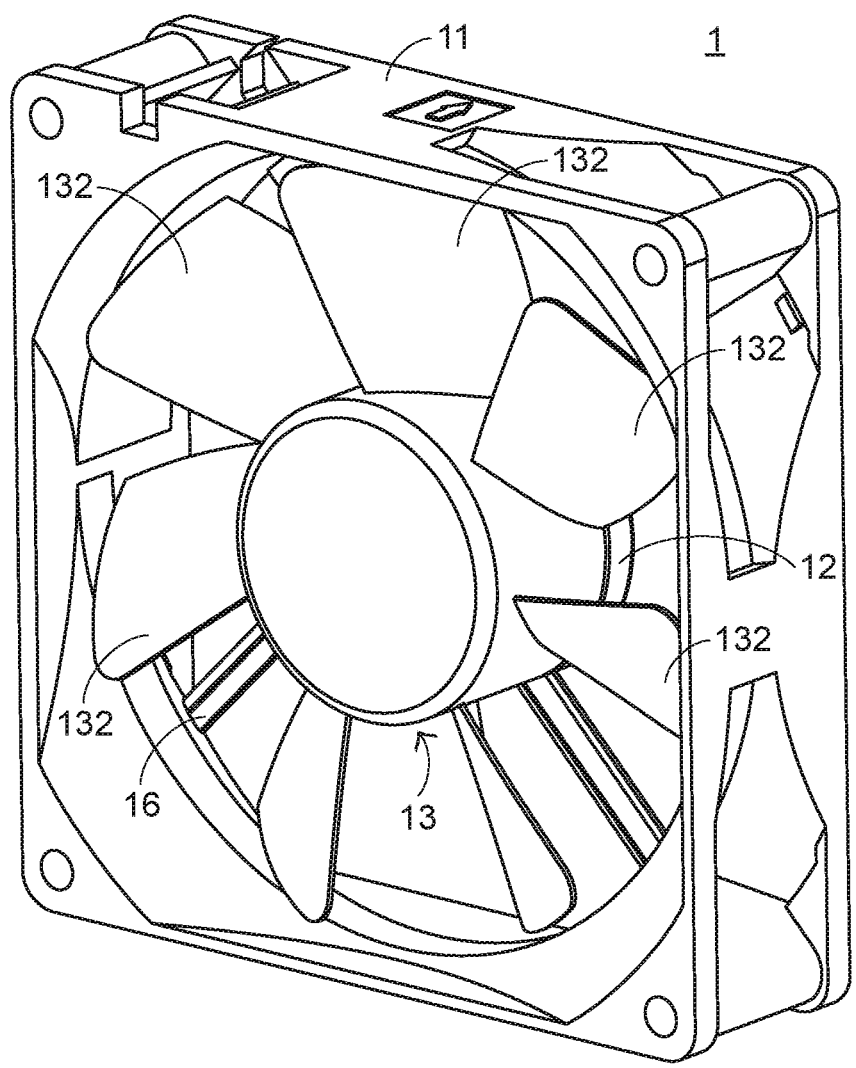
FIG. 1 is a schematic perspective view illustrating the outer appearance of a conventional cooling fan with an illuminating function.
Figure 2:
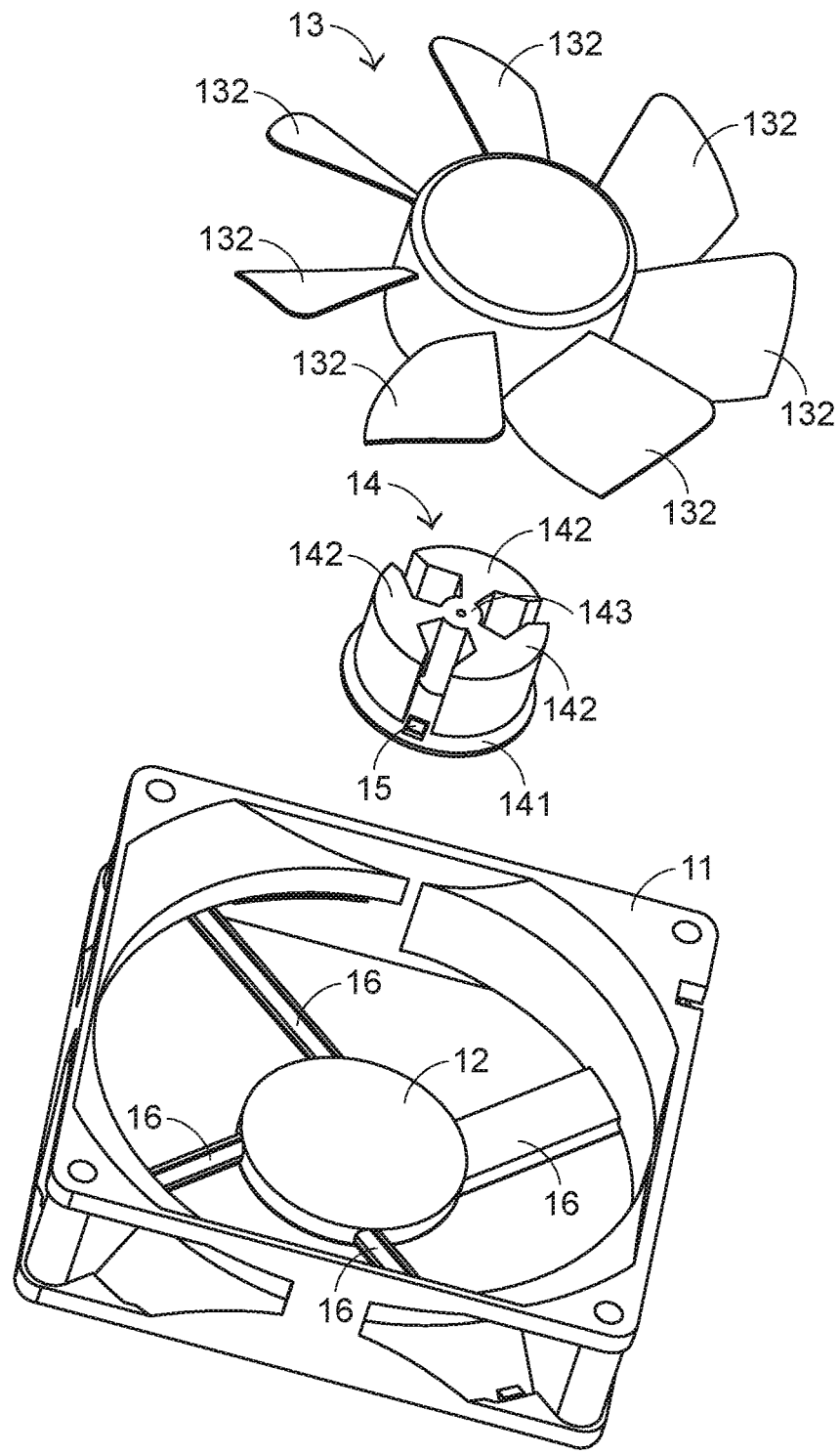
FIG. 2 is a schematic exploded view illustrating a portion of the conventional cooling fan as shown in FIG. 1 and taken along a viewpoint.
Figure 3:
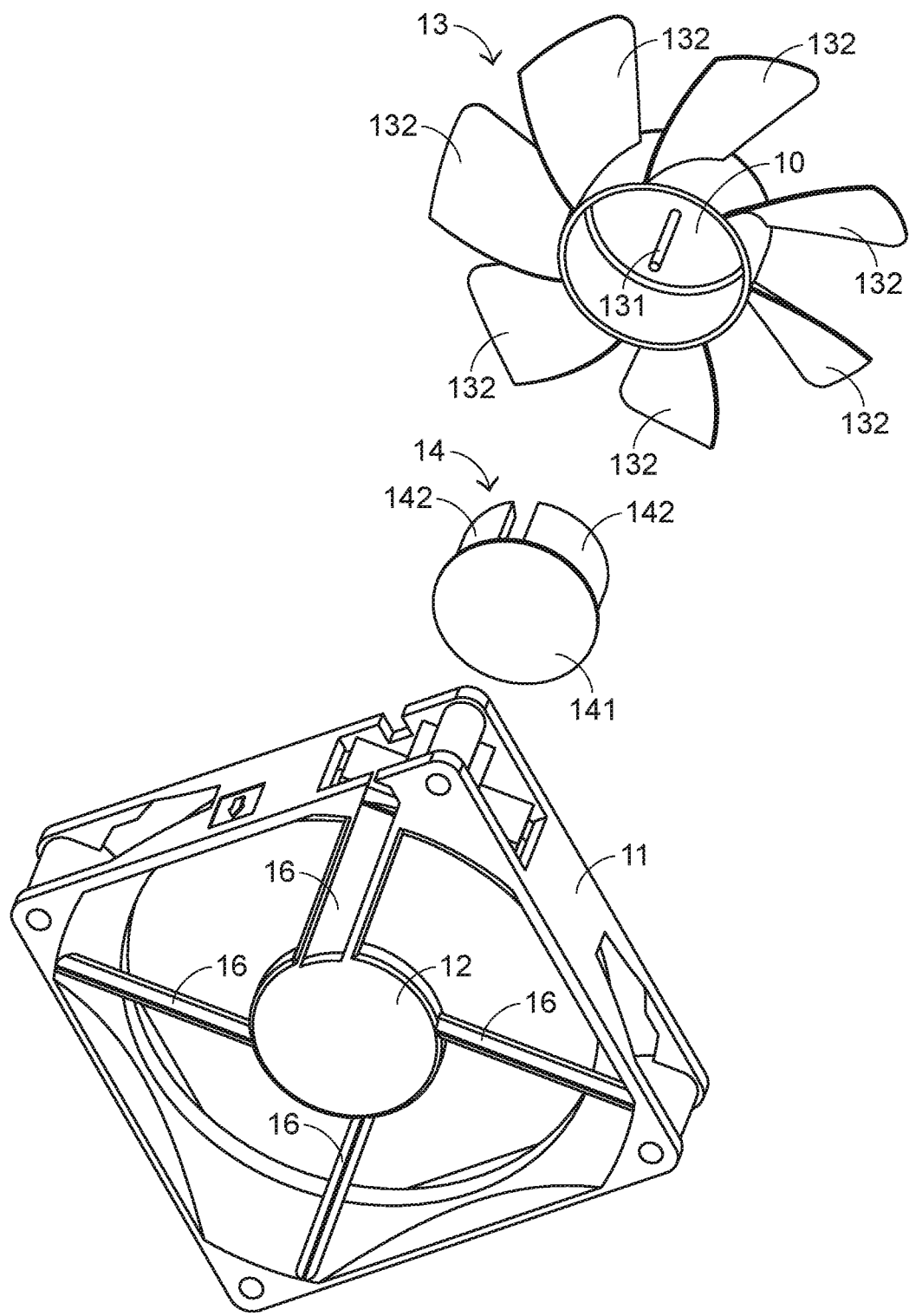
FIG. 3 is a schematic exploded view illustrating a portion of the conventional cooling fan as shown in FIG. 1 and taken along another viewpoint.
Figure 4:
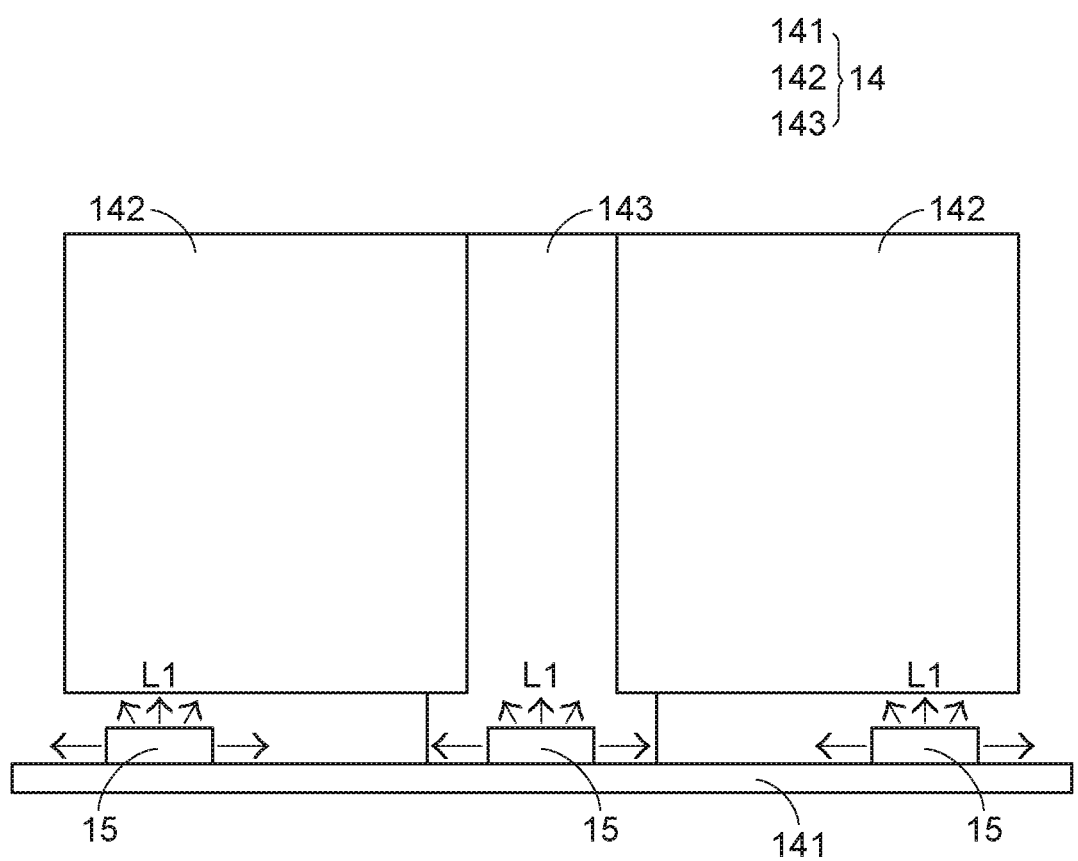
FIG. 4 is a schematic side view illustrating the relationship between the driving part and the light emitting diodes of the conventional cooling fan as shown in FIG. 1.
Figure 5:
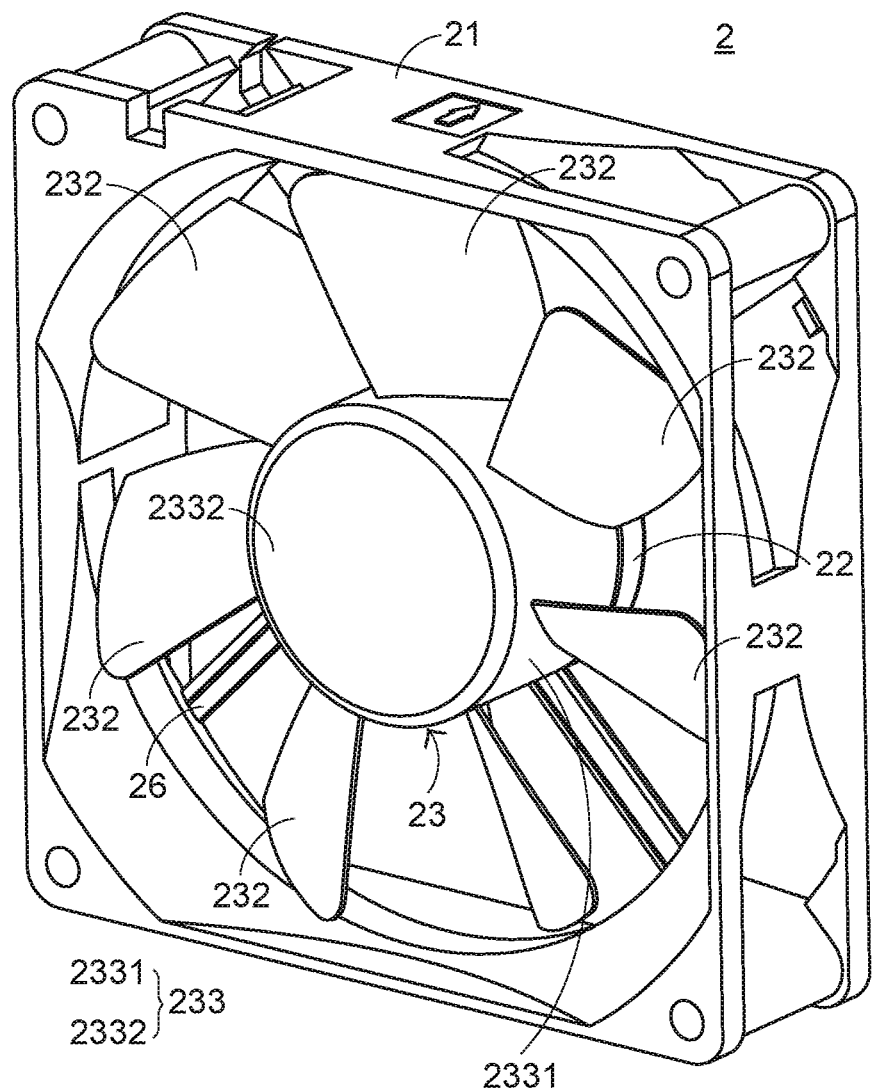
FIG. 5 is a schematic perspective view illustrating the outer appearance of a cooling fan according to a first embodiment of the present invention.
Figure 6:
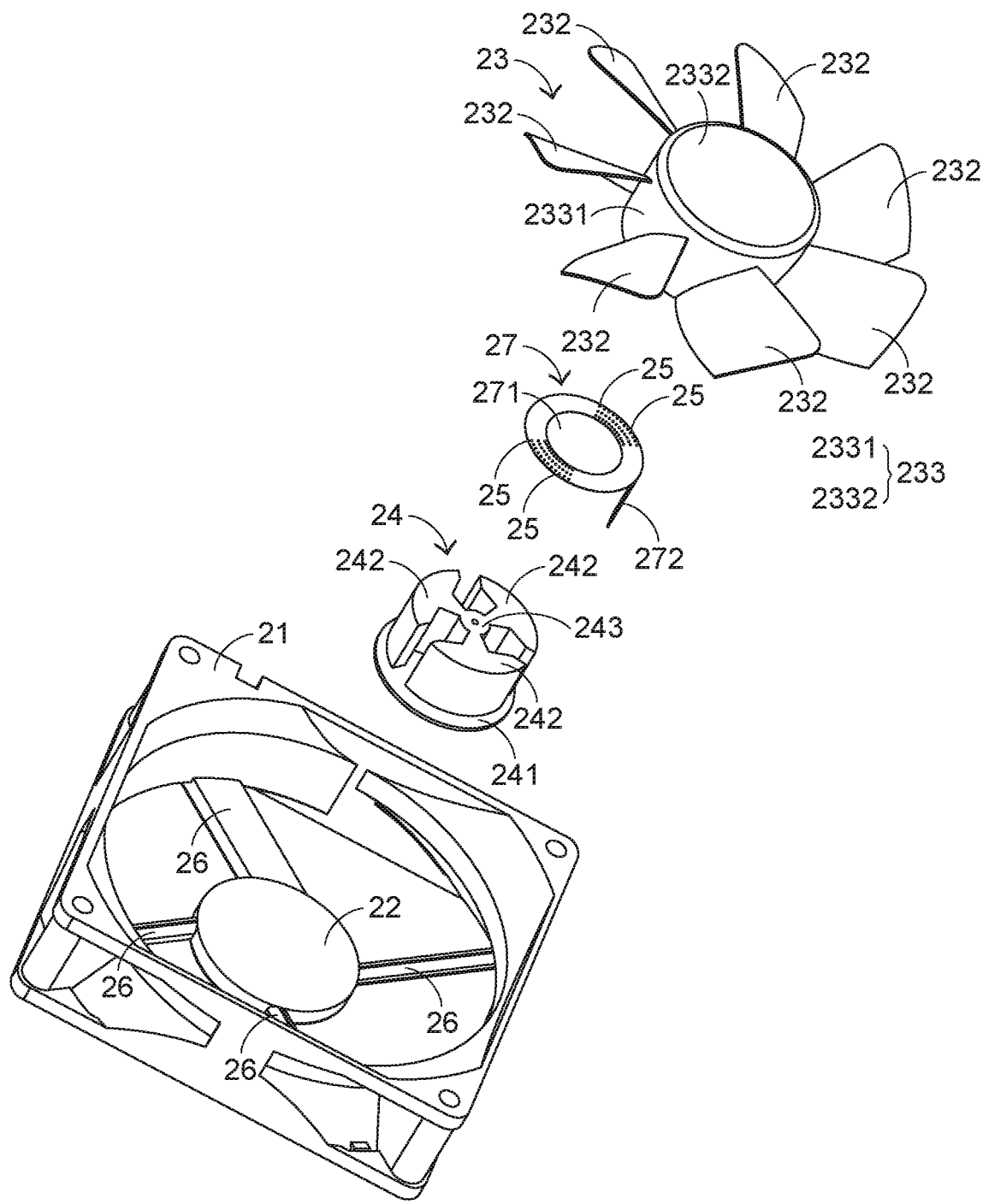
FIG. 6 is a schematic exploded view illustrating a portion of the cooling fan as shown in FIG. 5 and taken along a viewpoint.
Figure 7:
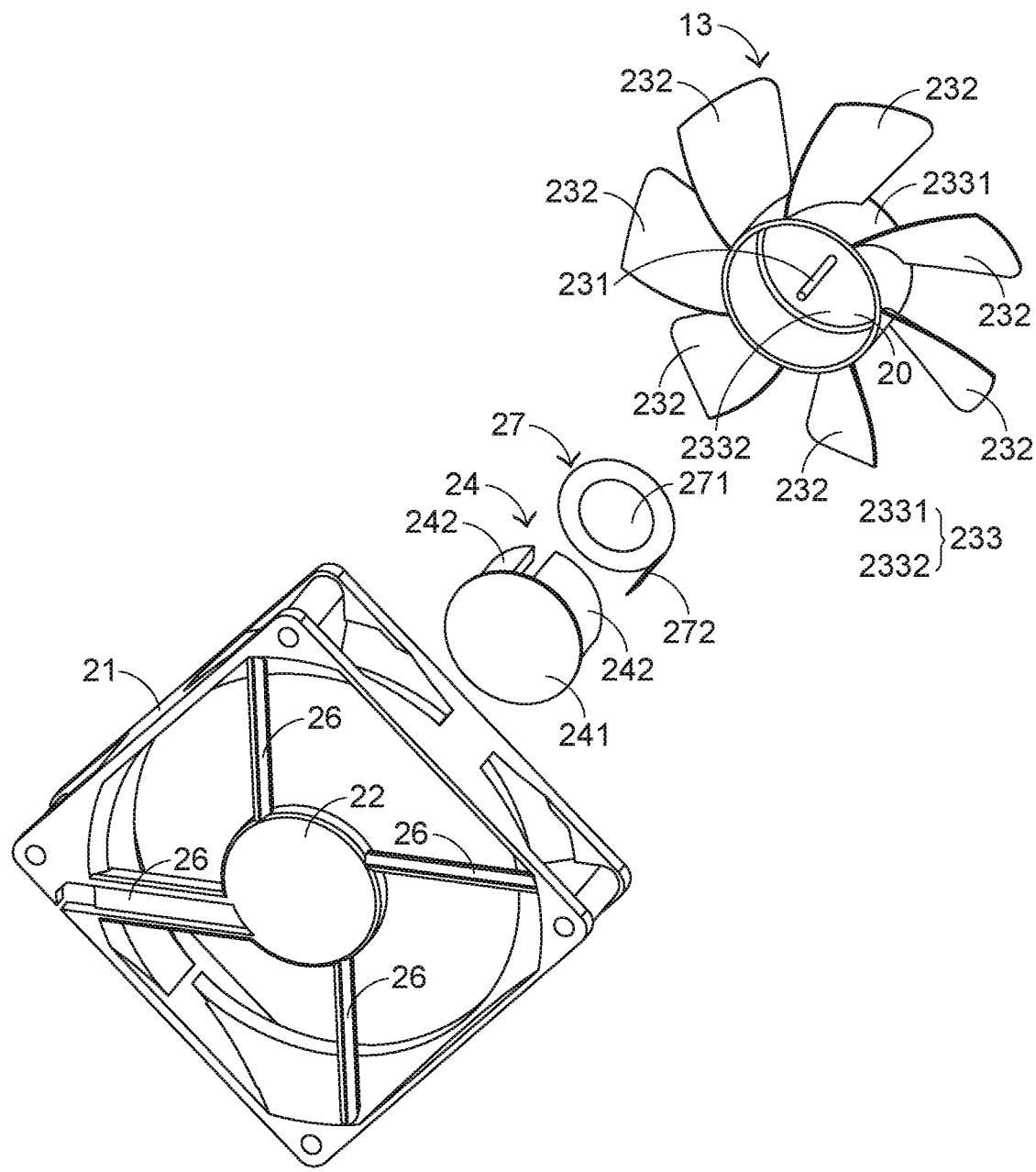
FIG. 7 is a schematic exploded view illustrating a portion of the cooling fan as shown in FIG. 5 and taken along another viewpoint.
Figure 8:
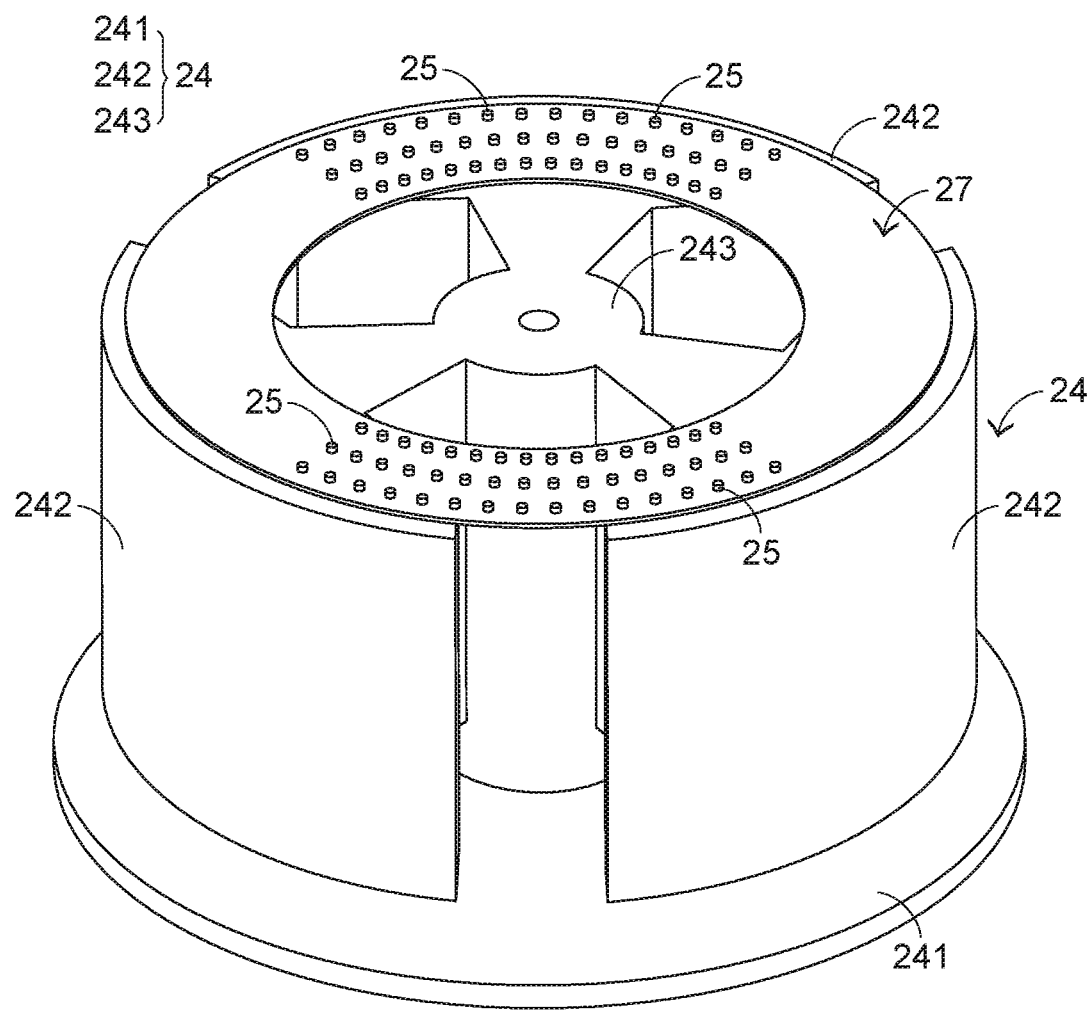
FIG. 8 is a schematic perspective view illustrating the driving part, the illumination circuit board and the plural light-emitting elements of the cooling fan as shown in FIG. 5.

Please refer to FIGS. 5, 6, 7 and 8. FIG. 5 is a schematic perspective view illustrating the outer appearance of a cooling fan according to a first embodiment of the present invention. FIG. 6 is a schematic exploded view illustrating a portion of the cooling fan as shown in FIG. 5 and taken along a viewpoint. FIG. 7 is a schematic exploded view illustrating a portion of the cooling fan as shown in FIG. 5 and taken along another viewpoint. FIG. 8 is a schematic perspective view illustrating the driving part, the illumination circuit board and the plural light-emitting elements of the cooling fan as shown in FIG. 5. In this embodiment, the cooling fan 2 comprises a fan frame 21, a fan base 22, an impeller part 23, a driving part 24, plural light-emitting elements 25, plural connecting elements 26 and an illumination circuit board 27. The plural connecting elements 26 are connected between the fan base 22 and the fan frame 21. Consequently, the fan base 22 is fixed at the middle region of the fan frame 21, or the fan base 22 is fixed at the position near the middle region of the fan frame 21. The driving part 24 and the illumination circuit board 27 are disposed within an accommodation space 20 between the impeller part 23 and the fan base 22.

The impeller part 23 is disposed within the fan frame 21. Moreover, the impeller part 23 comprises a rotating shaft 231 and plural blades 232. The plural blades 232 are arranged around the rotating shaft 231. The driving part 24 comprises a driving circuit board 241, plural coils 242 and a shaft seat 243. The driving circuit board 241 is disposed on the fan base 22. The plural coils 242 are arranged between the driving circuit board 241 and the illumination circuit board 27. The shaft seat 243 is surrounded by the plural coils 242. The rotating shaft 231 of the impeller part 23 is inserted into the shaft seat 243, and thus the rotating shaft 231 is pivotally coupled to the shaft seat 243. When an electric current from the driving circuit board 241 flows through the plural coils 242, the rotating shaft 231 of the impeller part 23 is rotated. In response to the rotation of the rotating shaft 231, the plural blades 231 are correspondingly rotated to drive the airflow. The airflow is helpful to dissipate away the heat. The operating principles of driving the rotation of the rotating shaft 231 of the impeller part 23 in response to the electric current from the plural coils 242 are well known to those skilled in the art, and are not redundantly described herein.

In this embodiment, the impeller part 23 further comprises a hub 233. At least a portion of the hub 233 is made of a transparent material, or the hub 233 has an opening (not shown) for allowing the light beams to go through. The accommodation space 20 is formed between the hub 233 and the fan base 22. The hub 233 comprises a sidewall 2331 and a covering body 2332. The sidewall 2331 is covered by the covering body 2332. The plural blades 232 are connected with the sidewall 2331. A first end of the rotating shaft 231 is disposed within the hub 233 and connected with the covering body 2332. A second end of the rotating shaft 231 is protruded outside the hub 233 and inserted into the shaft seat 243 of the driving part 24.

Figure 9:
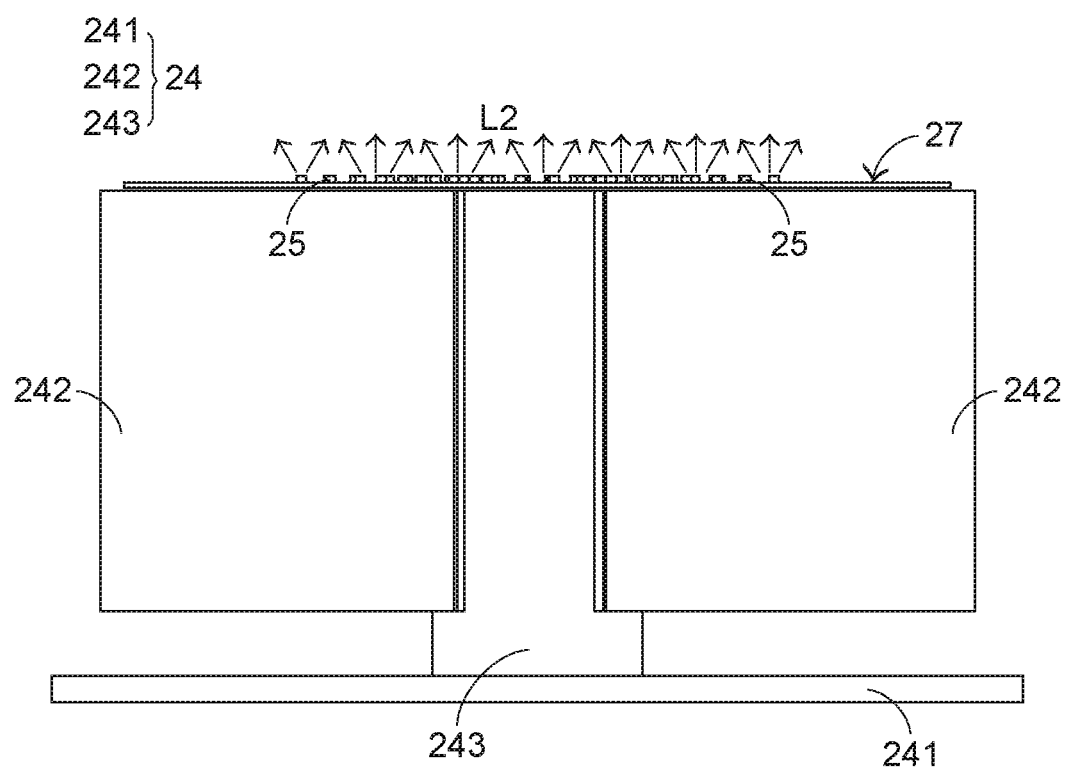
FIG. 9 is a schematic side view illustrating the driving part, the illumination circuit board and the light-emitting elements of the cooling fan as shown in FIG. 8.

FIG. 9 is a schematic side view illustrating the driving part, the illumination circuit board and the light-emitting elements of the cooling fan as shown in FIG. 8. The plural light-emitting elements 25 are disposed on the illumination circuit board 27. The illumination circuit board 27 is located over the plural coils 242. Moreover, the illumination circuit board 27 comprises a hollow portion 271. The rotating shaft 231 of the impeller part 23 is penetrated through the hollow portion 271. The illumination circuit board 27 is electrically connected with the driving circuit board 241 or a power source (not shown) through a connecting part (e.g., a cable 272) to receive the electric current. Consequently, the light-emitting elements 25 on the illumination circuit board 27 provide the light beams L2. In an embodiment, the illumination circuit board 27 is a flexible printed circuit board, and the light-emitting elements 25 are light emitting diodes. It is noted that the examples of the illumination circuit board 27 and the light-emitting elements 25 are not restricted.

As shown in FIGS. 6,7,8 and 9, the illumination circuit board 27 for supporting the light-emitting elements 25 is arranged between the hub 233 of the impeller part 23 and the plural coils 242 of the driving part 24. Consequently, a greater portion of the light beams L2 from the light-emitting elements 25 are directly transmitted through the hub 233 of the impeller part 23 without being obstructed by other components. In such way, the illuminating efficacy is enhanced. In comparison with the conventional cooling fan 1 with the illuminating function, the luminance of the cooling fan 2 of the present invention is enhanced, and the beam angle light beams L2 to be outputted from the cooling fan 2 is increased.

Figure 10:
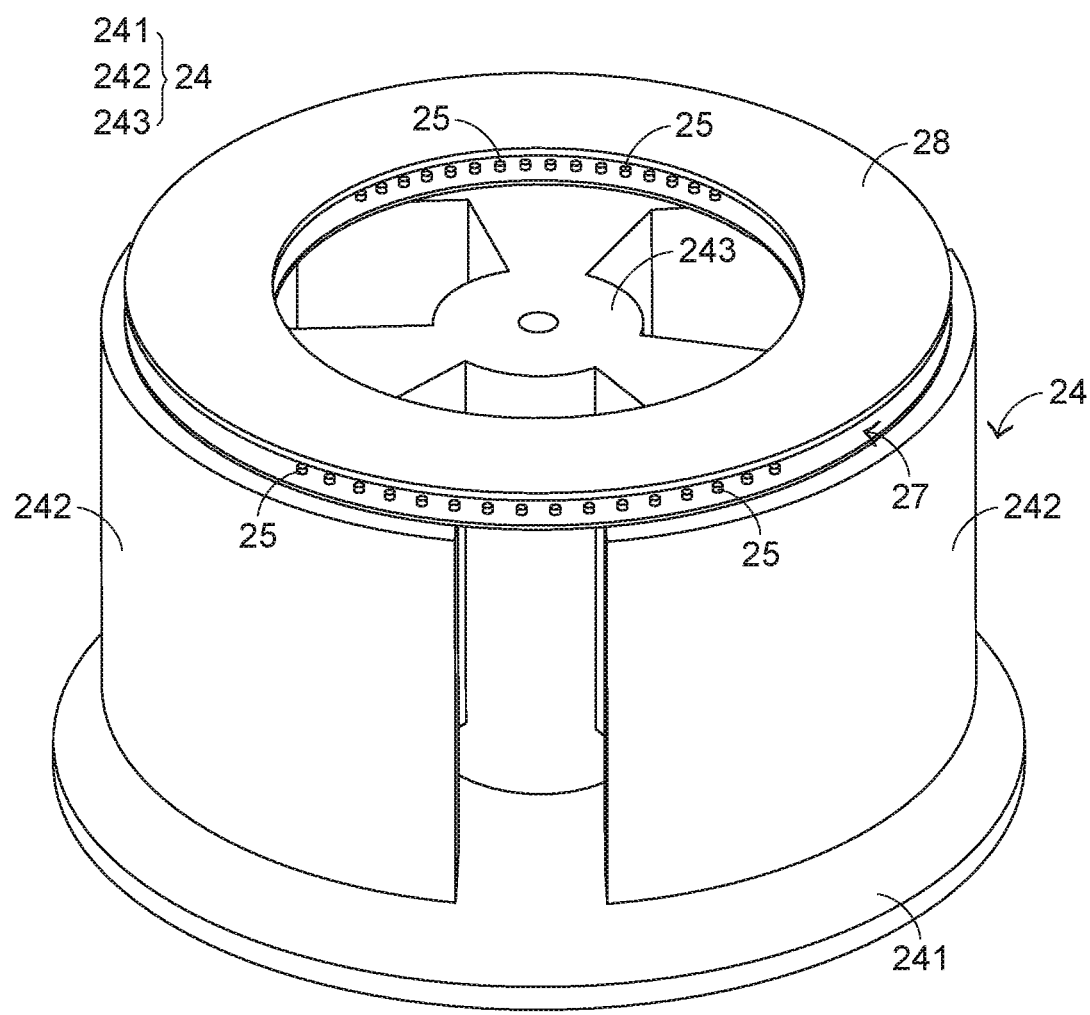
FIG. 10 is a schematic perspective view illustrating a driving part, an illumination circuit board, plural light-emitting elements and a diffuser of a cooling fan according to a second embodiment of the present invention.
Figure 11:
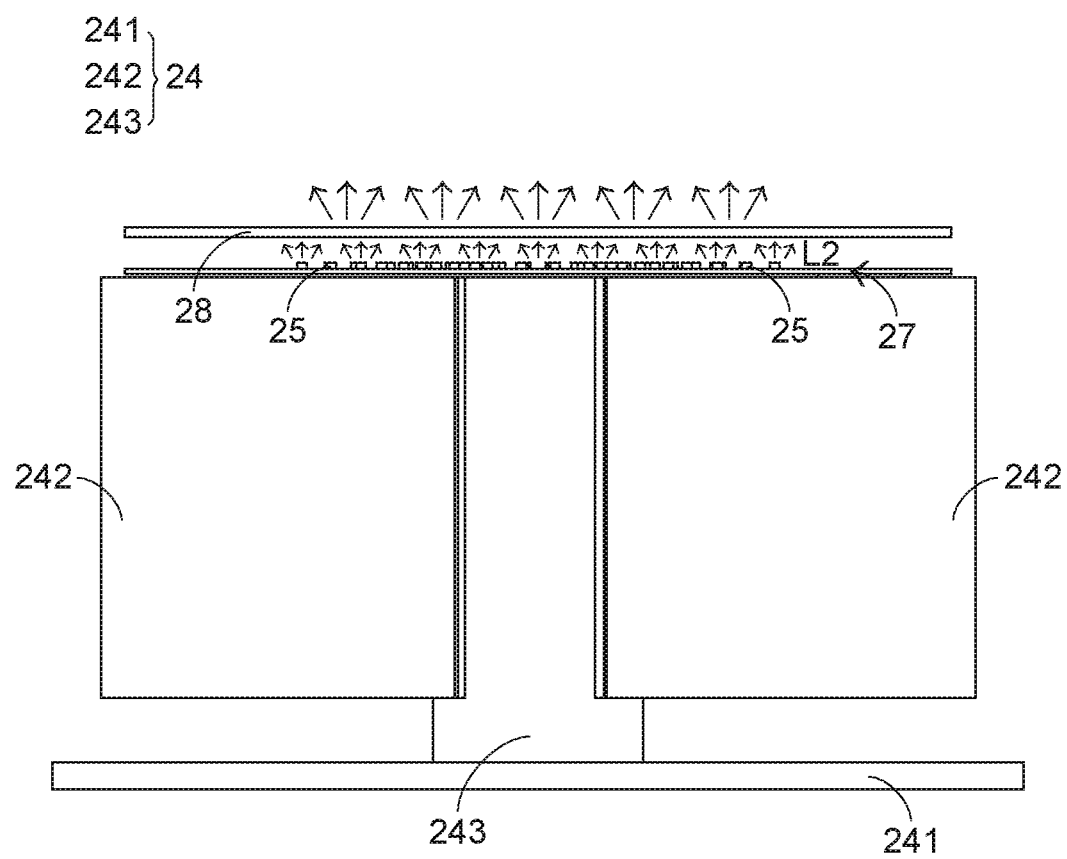
FIG. 11 is a schematic side view illustrating the driving part, the illumination circuit board, the plural light-emitting elements and the diffuser of the cooling fan as shown in FIG. 10.

Please refer to FIGS. 10 and 11. FIG. 10 is a schematic perspective view illustrating a driving part, an illumination circuit board, plural light-emitting elements and a diffuser of a cooling fan according to a second embodiment of the present invention. FIG. 11 is a schematic side view illustrating the driving part, the illumination circuit board, the plural light-emitting elements and the diffuser of the cooling fan as shown in FIG. 10. The structures and functions of the components of the cooling fan which are identical to those of the first embodiment are not redundantly described herein. In comparison with the first embodiment, the cooling fan of this embodiment further comprises a diffuser 28. The diffuser 28 is arranged in the travelling path of the light beams L2 from the plural light-emitting elements 25. Moreover, the diffuser 28 is arranged within the accommodation space (see FIGS. 5~7) between the impeller part (see FIGS. 5~7) and the fan base (see FIGS. 5~7).

In this embodiment, the diffuser 28 is arranged between the illumination circuit board 27 and the covering body (see FIGS. 5~7) of the hub (see FIGS. 5~7) of the impeller part (see FIGS. 5~7). When the electric current is provided to the light-emitting elements 25 through the illumination circuit board 27, the light beams L2 from the light-emitting elements 25 are transmitted to the hub 233 of the impeller part 23 through the diffuser 28. Due to the arrangement of the diffuser 28, some benefits are provided. For example, the light beams L2 passing through the diffuser 28 are softened. Consequently, the user will not view the light spots corresponding to the plural light-emitting elements 25 (i.e., plural light sources). In other words, the cooling fan produces the luminous effect of a plane light source.

Figure 12:
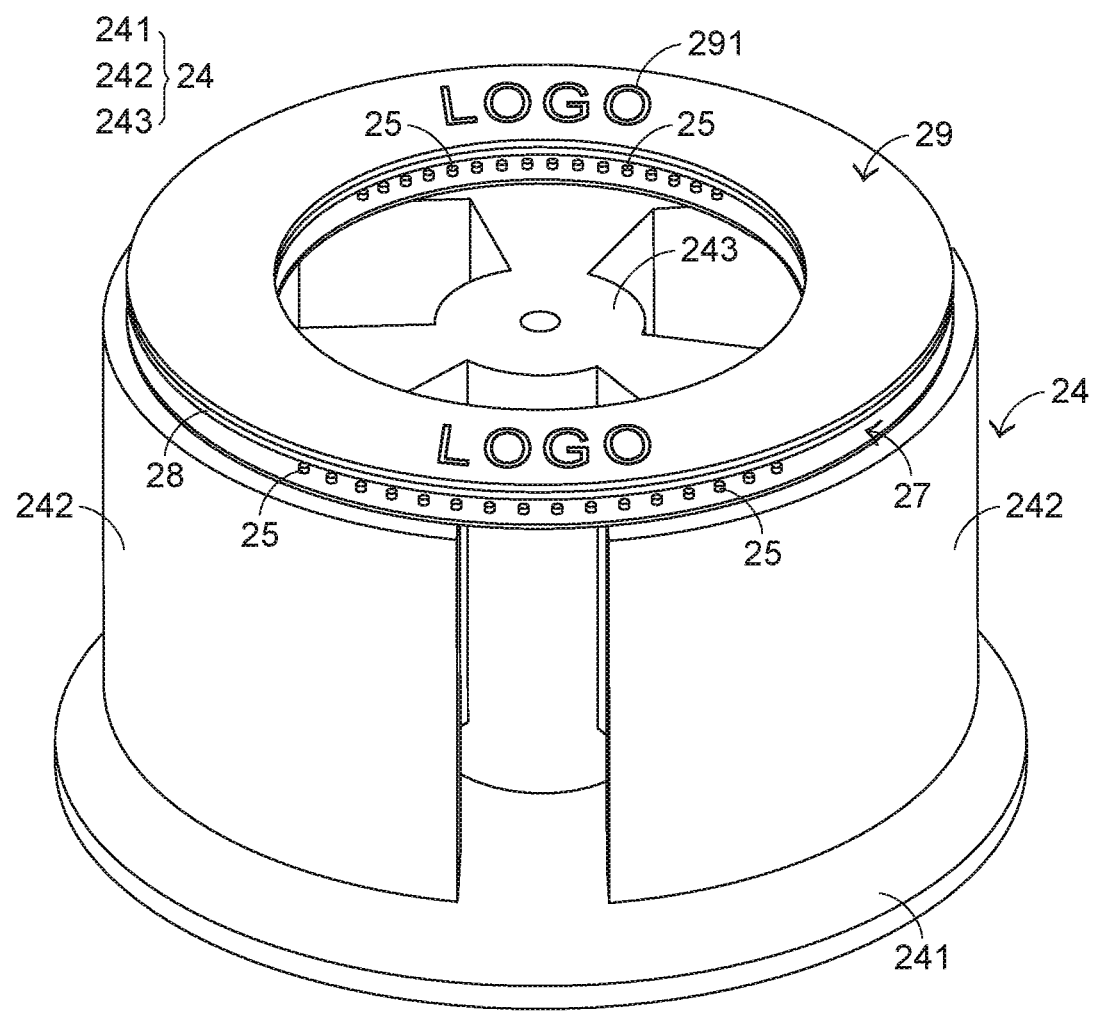
FIG. 12 is a schematic perspective view illustrating a driving part, an illumination circuit board, plural light-emitting elements, a diffuser and a projection plate of a cooling fan according to a third embodiment of the present invention.
Figure 13:
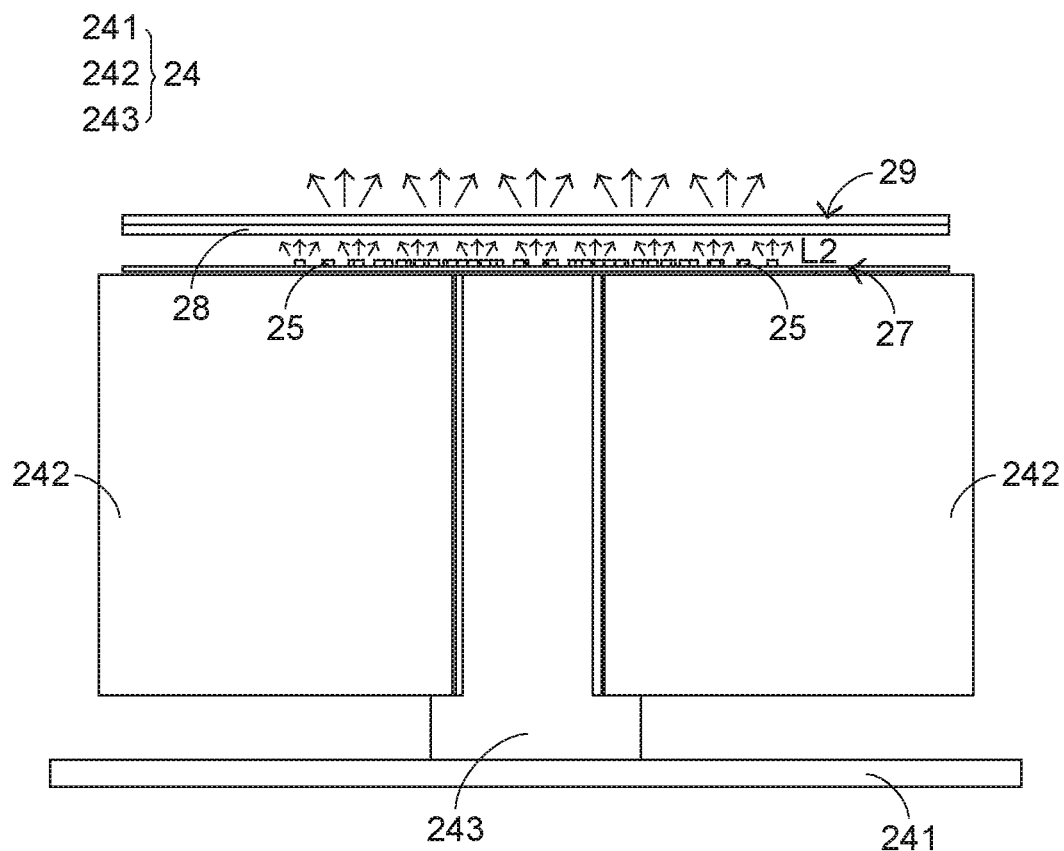
FIG. 13 is a schematic side view illustrating the driving part, the illumination circuit board, the plural light-emitting elements, the diffuser and the projection plate of the cooling fan as shown in FIG. 12.

Please refer to FIGS. 12 and 13. FIG. 12 is a schematic perspective view illustrating a driving part, an illumination circuit board, plural light-emitting elements, a diffuser and a projection plate of a cooling fan according to a third embodiment of the present invention. FIG. 13 is a schematic side view illustrating the driving part, the illumination circuit board, the plural light-emitting elements, the diffuser and the projection plate of the cooling fan as shown in FIG. 12. The structures and functions of the components of the cooling fan which are identical to those of the second embodiment are not redundantly described herein. In comparison with the second embodiment, the cooling fan of this embodiment further comprises a projection plate 29. The projection plate 29 has a pattern 291. The projection plate 29 is arranged in the travelling path of the light beams L2 from the plural light-emitting elements 25. Moreover, the projection plate 29 is arranged within the accommodation space (see FIGS. 5~7) between the impeller part (see FIGS. 5~7) and the fan base (see FIGS. 5~7).

In an embodiment, the projection plate 29 is arranged between the diffuser 28 and the covering body (see FIGS. 5~7) of the hub (see FIGS. 5~7) of the impeller part (see FIGS. 5~7). For example, the projection plate 29 is a film. The pattern 291 on the projection plate 29 indicates the information to be displayed (e.g., a logo). The pattern 291 is formed on the film through a printing process or a developing process. The way of forming the pattern 291 is well known to those skilled in the art, and is not redundantly described herein.

In an embodiment, the hub (see FIGS. 5~7) of the impeller part (see FIGS. 5~7) is made of a transparent material. When the electric current is provided to the light-emitting elements 25 through the illumination circuit board 27, the light beams L2 from the light-emitting elements 25 are sequentially transmitted through the diffuser 28 and the projection plate 29. Since the pattern 291 on the projection plate 29 are projected outside the hub of the impeller part, the visual effect is provided.

In another embodiment, the covering body (see FIGS. 5~7) of the hub (see FIGS. 5~7) of the impeller part (see FIGS. 5~7) is made of a light-transmissible material and has a diffusion structure. When the electric current is provided to the light-emitting elements 25 through the illumination circuit board 27, the light beams L2 from the light-emitting elements 25 are sequentially transmitted through the diffuser 28 and the projection plate 29. The pattern 291 on the projection plate 29 are projected to the covering body of the hub of the impeller part and imaged on the covering body.

It is noted that numerous modifications and alterations may be made while retaining the teachings of the invention. For example, the cooling fan of the third embodiment is not equipped with the diffuser. Alternatively, in another embodiment, the plural light-emitting elements are individually controlled to provide the light beams according to the individual time sequences. Consequently, the cooling fan produces different visual effects.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A cooling fan, comprising:
   a fan base;
   an impeller part comprising a rotating shaft and plural blades, wherein the plural blades are arranged around the rotating shaft, and the impeller part is rotated with the rotating shaft;
   an illumination circuit board comprising a hollow portion, wherein the rotating shaft is penetrated through the hollow portion;
   a driving part comprising a shaft seat, a driving circuit board and plural coils, wherein the driving circuit board is disposed on the fan base, the plural coils are arranged between the driving circuit board and the illumination circuit board and arranged around the shaft seat, and the rotating shaft is inserted into the shaft seat, wherein when the an electric current flows through the plural coils, the rotating shaft is rotated;
   at least one light-emitting element disposed on the illumination circuit board, wherein when the electric current flows through the at least one light-emitting element, the at least one light-emitting element emits plural light beams; and
   a projection plate, which is arranged in a travelling path of at least one light beam of the plural light beams and has a pattern, wherein after the at least one light beam passes through the pattern of the projection plate, the at least one light beam is projected to surroundings.

2. The cooling fan according to claim 1, wherein the cooling fan further comprises a diffuser, which is arranged in a travelling path of at least one light beam of the plural light beams.

3. The cooling fan according to claim 1, wherein the projection plate is a film.

4. The cooling fan according to claim 3, wherein the pattern is formed on the film through a printing process or a developing process.

5. The cooling fan according to claim 1, wherein the illumination circuit board is a flexible printed circuit board.

6. The cooling fan according to claim 1, wherein the illumination circuit board and the driving part are disposed within an accommodation space between the impeller part and the fan base.

7. The cooling fan according to claim 6, wherein the impeller part further comprises a hub, and the hub comprises at least one sidewall and a covering body, wherein the at least one sidewall is covered by the covering body, the plural blades are connected with the at least one sidewall, a first end of the rotating shaft is disposed within the hub and connected with the covering body, and a second end of the rotating shaft is protruded outside the hub.

8. The cooling fan according to claim 1, wherein the cooling fan further comprises a fan frame and plural connecting elements, wherein the fan base is fixed at a middle region of the fan frame, or the fan base is fixed at a position near the middle region of the fan frame, wherein each of the plural connecting elements is connected between the fan base and the fan frame so as to fix the fan base.

9. The cooling fan according to claim 8, wherein the impeller part is disposed within the fan frame.

10. The cooling fan according to claim 1, wherein each of the at least one light-emitting element is a light emitting diode.

\* \* \* \* \*